(12) United States Patent
Hsieh et al.

(10) Patent No.: US 9,672,920 B2
(45) Date of Patent: Jun. 6, 2017

(54) ELECTRONIC DEVICE, NON-VOLATILE MEMORTY DEVICE, AND PROGRAMMING METHOD

(71) Applicant: Macronix International Co., Ltd., Hsinchu (TW)

(72) Inventors: Chih-Chang Hsieh, Hsinchu (TW); Ti Wen Chen, Tainan (TW); Yungchun Li, New Taipei (TW); Hang Ting Lue, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 108 days.

(21) Appl. No.: 14/657,084

(22) Filed: Mar. 13, 2015

(65) Prior Publication Data

US 2016/0267987 A1    Sep. 15, 2016

(51) Int. Cl.
*G11C 16/10*    (2006.01)
*G11C 16/34*    (2006.01)

(52) U.S. Cl.
CPC .......... *G11C 16/10* (2013.01); *G11C 16/3427* (2013.01); *G11C 16/3459* (2013.01)

(58) Field of Classification Search
CPC ............................ G11C 16/10; G11C 16/3459
USPC ..................................................... 365/185.19
See application file for complete search history.

(56) References Cited

U.S. PATENT DOCUMENTS

| 2012/0239976 A1* | 9/2012 | Cometti ................. G11C 16/26 714/24 |
| 2012/0281481 A1* | 11/2012 | Lue ..................... G11C 16/0483 365/185.23 |
| 2013/0163344 A1* | 6/2013 | Jones ................. G11C 16/3454 365/185.22 |

* cited by examiner

*Primary Examiner* — Son Mai
*Assistant Examiner* — Muna A Techane
(74) *Attorney, Agent, or Firm* — Finnegan, Henderson, Farabow, Garrett & Dunner LLP

(57) ABSTRACT

This disclosure provides a memory device. The memory device includes a plurality of memory cells and a control circuit coupled to the memory cells. The control circuit is configured to provide a first programming voltage to the memory cells; verify the memory cells against an interim level verify voltage to divide the memory cells into a first group of memory cells and a second group of memory cells according to whether the memory cells do not reach or do reach the interim level verify voltage, respectively; provide a second programming voltage to the first group of memory cells and inhibit the second group of memory cells from receiving the second programming voltage, the second programming voltage being greater than or equal to the first programming voltage; and verify the first group of memory cells and the second group of memory cells against a desired level voltage.

10 Claims, 13 Drawing Sheets

ELECTRONIC DEVICE, NON-VOLATILE MEMORTY DEVICE, AND PROGRAMMING METHOD

FIELD

Example embodiments relate to an electronic device and, more particularly, to an electronic device including a non-volatile memory device and a method for programming a memory device.

BACKGROUND

Recently, more and more electronic devices incorporate non-volatile semiconductor memory devices. Particularly, flash memory, because of its capability to retain data without power supply, is in high demand. In order to increase storage density per area of flash memory, a multi-level cell (MLC) memory has been proposed, in which a single memory cell of MLC memory can store multiple bits of data. MLC memory usually utilizes a programming method to define multiple threshold voltages in a cell to achieve the capability of storing multiple bits of data in one memory cell.

One commonly-used programming method is incremental step pulse programming (ISPP). In an ISPP method, a programming voltage applied to a memory cell is gradually increased through a plurality of increments until the programming voltage reaches a level to sufficiently program the memory cell to a desired state. After each programming voltage is applied to the memory cell, a verify voltage is applied to the memory cell to determine whether the memory cell has been brought to the desired state. Thus, in the ISPP method, repeated program-and-verify steps are performed for individual memory cells of a flash memory device. However, to improve accuracy of programming a memory cell, the increments of the program voltage should be small. This increases the time to program a memory cell.

SUMMARY OF EMBODIMENTS

Consistent with embodiments of this disclosure, there is provided a memory device including a plurality of memory cells and a control circuit coupled to the memory cells. The control circuit is configured to provide a first programming voltage to the memory cells; verify the memory cells against an interim level verify voltage to divide the memory cells into a first group of memory cells and a second group of memory cells according to whether the memory cells do not reach or do reach the interim level verify voltage, respectively; provide a second programming voltage to the first group of memory cells and inhibit the second group of memory cells from receiving the second programming voltage, the second programming voltage being greater than or equal to the first programming voltage; and verify the first group of memory cells and the second group of memory cells against a desired level voltage.

Consistent with embodiments of this disclosure, there is also provided a method of programming memory cells of a memory device, including providing a first programming voltage to the memory cells; verifying the memory cells against an interim level verify voltage to divide the memory cells into a first group of memory cells and a second group of memory cells according to whether the memory cells do not reach or do reach the interim level verify voltage, respectively; providing a second programming voltage to the first group of memory cells and inhibiting the second group of memory cells from receiving the second programming voltage, the second programming voltage being greater than or equal to the first programming voltage; and verifying the first group of memory cells and the second group of memory cells against a desired level voltage.

Consistent with embodiments of this disclosure, there is further provided a non-transitory storage medium tangibly storing instructions. The instructions, when executed by a processor, cause the processor to perform a method of programming memory cells of a memory device. The method includes providing a first programming voltage to the memory cells; verifying the memory cells against an interim level verify voltage to divide the memory cells into a first group of memory cells and a second group of memory cells according to whether the memory cells do not reach or do reach the interim level verify voltage, respectively; providing a second programming voltage to the first group of memory cells and inhibiting the second group of memory cells from receiving the second programming voltage, the second programming voltage being greater than or equal to the first programming voltage; and verifying the first group of memory cells and the second group of memory cells against a desired level voltage.

Consistent with embodiments of this disclosure, there is additionally provided an electronic device having a memory device, the memory device including a plurality of memory cells and a control circuit coupled to the memory cells. The control circuit is configured to provide a first programming voltage to the memory cells; verify the memory cells against an interim level verify voltage to divide the memory cells into a first group of memory cells and a second group of memory cells according to whether the memory cells do not reach or do reach the interim level verify voltage, respectively; provide a second programming voltage to the first group of memory cells and inhibit the second group of memory cells from receiving the second programming voltage, the second programming voltage being greater than or equal to the first programming voltage; and verify the first group of memory cells and the second group of memory cells against a desired level voltage.

Consistent with embodiments of this disclosure, there is provided a memory device including a plurality of memory cells and a control circuit coupled to the memory cells. The control circuit is configured to provide a first programming voltage to the memory cells; verify the memory cells against an interim level verify voltage to divide the memory cells into a first group of memory cells and a second group of memory cells according to whether the memory cells do not reach or do reach the interim level verify voltage, respectively; provide a second programming voltage to the first group of memory cells and inhibit the second group of memory cells from receiving the second programming voltage, the second programming voltage being greater than or equal to the first programming voltage; provide a first first-group programming voltage to the first group of memory cells, and verify the first group of memory cells against a desired level voltage; provide a second first-group programming voltage to memory cells of the first group having a voltage level less than the desired level voltage, and verify the memory cells receiving the second first-group programming voltage against the desired level voltage; provide a first second-group programming voltage to the second group of memory cells, and verify the second group of memory cells against the desired level voltage; and provide a second second-group programming voltage to memory cells of the second group having a voltage level less than the desired level voltage, and verify the memory cells receiving the second second-group programming voltage against the desired level voltage, the first-group programming voltages being greater than the second group of memory cells.

Consistent with embodiments of this disclosure, there is also provided a method of programming memory cells of a memory device. The method includes providing a first programming voltage to the memory cells; verifying the memory cells against an interim level verify voltage to divide the memory cells into a first group of memory cells and a second group of memory cells according to whether the memory cells do not reach or do reach the interim level verify voltage, respectively; providing a second programming voltage to the first group of memory cells and inhibiting the second group of memory cells from receiving the second programming voltage, the second programming voltage being greater than or equal to the first programming voltage; providing a first first-group programming voltage to the first group of memory cells, and verifying the first group of memory cells against a desired level voltage; providing a second first-group programming voltage to memory cells of the first group having a voltage level less than the desired level voltage, and verifying the memory cells receiving the second first-group programming voltage against the desired level voltage; providing a first second-group programming voltage to the second group of memory cells, and verifying the second group of memory cells against the desired level voltage; and providing a second second-group programming voltage to memory cells of the second group having a voltage level less than the desired level voltage, and verifying the memory cells receiving the second second-group programming voltage against the desired level voltage, the first-group programming voltages being greater than the second group of memory cells.

Consistent with embodiments of this disclosure, there is provided a non-transitory storage medium tangibly storing instructions. The instructions, when executed by a processor, cause the processor to perform a method of programming memory cells of a memory device. The method includes providing a first programming voltage to the memory cells; verifying the memory cells against an interim level verify voltage to divide the memory cells into a first group of memory cells and a second group of memory cells according to whether the memory cells do not reach or do reach the interim level verify voltage, respectively; providing a second programming voltage to the first group of memory cells and inhibiting the second group of memory cells from receiving the second programming voltage, the second programming voltage being greater than or equal to the first programming voltage; providing a first first-group programming voltage to the first group of memory cells, and verifying the first group of memory cells against a desired level voltage; providing a second first-group programming voltage to memory cells of the first group having a voltage level less than the desired level voltage, and verifying the memory cells receiving the second first-group programming voltage against the desired level voltage; providing a first second-group programming voltage to the second group of memory cells, and verifying the second group of memory cells against the desired level voltage; and providing a second second-group programming voltage to memory cells of the second group having a voltage level less than the desired level voltage, and verifying the memory cells receiving the second second-group programming voltage against the desired level voltage, the first-group programming voltages being greater than the second group of memory cells Consistent with embodiments of this disclosure, there is provided an electronic device having a memory device, the memory device including a plurality of memory cells and a control circuit coupled to the memory cells. The control circuit is configured to provide a first programming voltage to the memory cells; verify the memory cells against an interim level verify voltage to divide the memory cells into a first group of memory cells and a second group of memory cells according to whether the memory cells do not reach or do reach the interim level verify voltage, respectively; provide a second programming voltage to the first group of memory cells and inhibit the second group of memory cells from receiving the second programming voltage, the second programming voltage being greater than or equal to the first programming voltage; provide a first first-group programming voltage to the first group of memory cells, and verify the first group of memory cells against a desired level voltage; provide a second first-group programming voltage to memory cells of the first group having a voltage level less than the desired level voltage, and verify the memory cells receiving the second first-group programming voltage against the desired level voltage; provide a first second-group programming voltage to the second group of memory cells, and verify the second group of memory cells against the desired level voltage; and provide a second second-group programming voltage to memory cells of the second group having a voltage level less than the desired level voltage, and verify the memory cells receiving the second second-group programming voltage against the desired level voltage, the first-group programming voltages being greater than the second group of memory cells.

BRIEF DESCRIPTION OF THE DRAWINGS

Reference will now be made, by way of example, to the accompanying drawings which show example embodiments of the present application, and in which.

DESCRIPTION OF EMBODIMENTS

Hereinafter, embodiments consistent with the disclosure will be described with reference to the drawings. Wherever possible, the same reference numbers will be used throughout the drawings to refer to the same or like parts.

Figure 1:
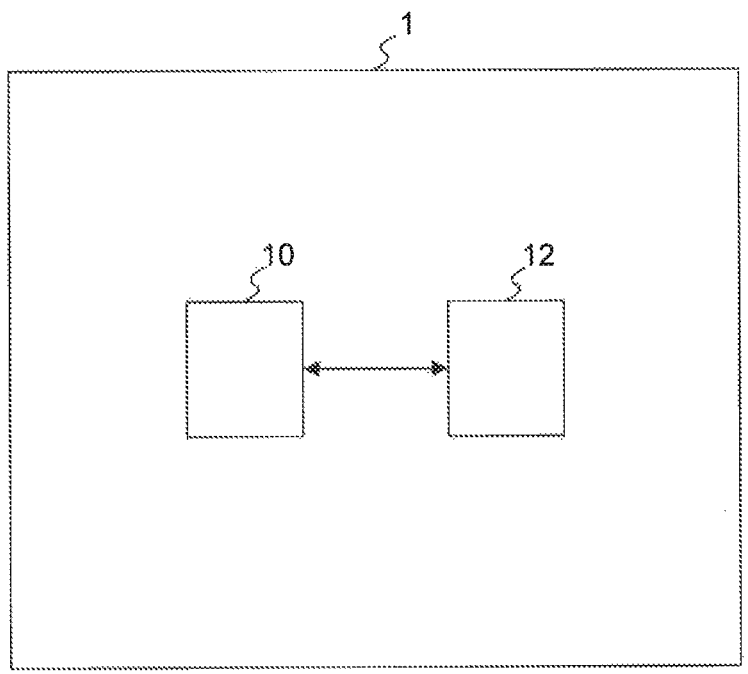
FIG. 1 shows an exemplary electronic device consistent with some embodiments of this disclosure.

Referring now to the drawings, FIG. 1 shows an exemplary electronic device 1. Electronic device 1 includes a processing circuit 10 and a memory device 12 coupled to each other. Memory device 12 may be embedded in electronic device 1 or detachable from electronic device 1. For example, memory device 12 may be a memory card that can be inserted into or detached from a socket of electronic device 1. Electronic device 1 may be, for example, a cell phone, a game station, a tablet, a TV, or any other similar kind of device. Processing circuit 10 can be, for example, a central processing unit (CPU) for performing calculation processes. Memory device 12 can be, for example, a flash memory device such as a NOR or a NAND flash memory.

Figure 2A:
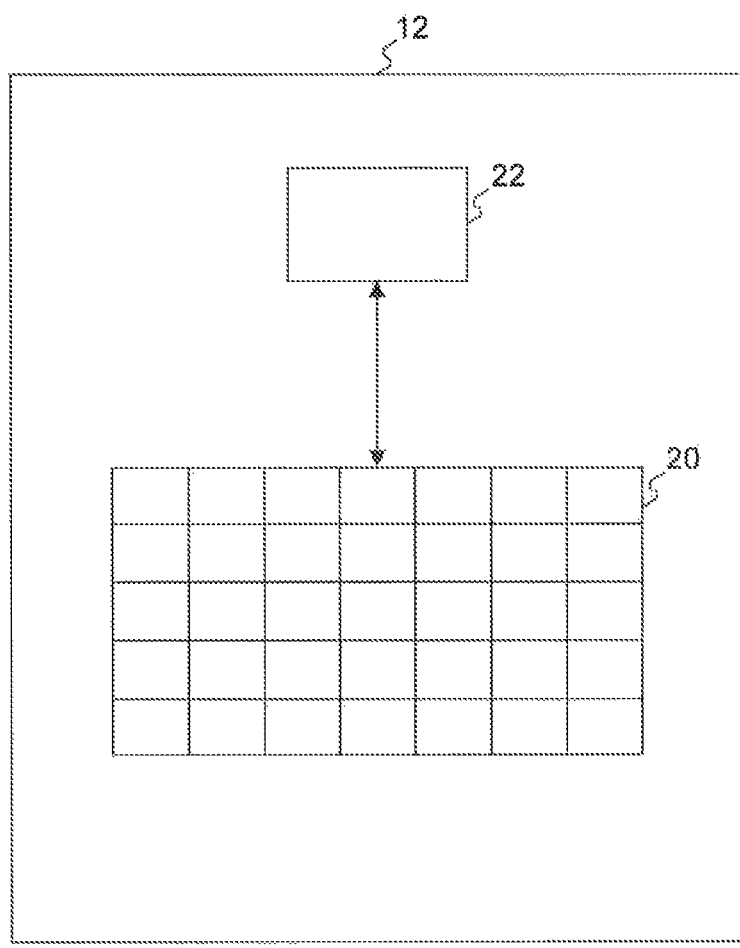
FIG. 2A shows an exemplary memory device consistent with some embodiments of this disclosure.

FIG. 2A shows an exemplary memory device 12. Memory device 12 includes a plurality of memory cells 20 and a control circuit 22 coupled to memory cells 20. Memory cells 20 may be, for example, single-level cells (SLC), double-level cells (DLC), triple-level cells (TLC), or, in general, multi-level cells (MLC). The number of levels is not limited. Control circuit 22 may be integrated with or separated from memory cells 20, and is configured to, for example, program, erase, or sense data in memory cells 20.

Figure 2B:
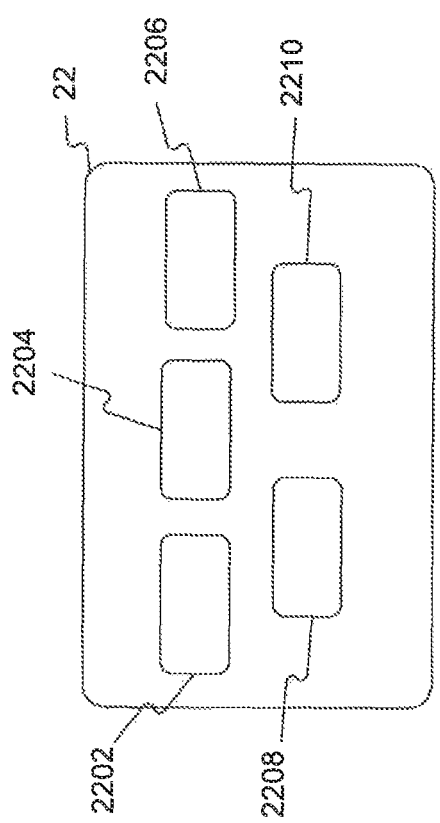
FIG. 2B shows a block diagram of an exemplary control circuit consistent with some embodiments of this disclosure.

FIG. 2B shows a block diagram of an exemplary construction of control circuit 22. Control circuit 22 includes a power unit 2202, a memory interface 2204, a clock unit 2206, a buffer unit 2208, and a state machine 2210. Power unit 2202 is configured to provide power to control circuit 22. Memory interface 2204 is configured to receive data or instructions from a host device, such as processing circuit 10 shown in FIG. 1. Clock unit 2206 is configured to generate clock signals for control circuit 22. Buffer unit 2208 is configured to stored data for memory cells 20 and grouping information, as will be discussed below. Buffer unit 2208 may include latch devices. State machine 2210 is configured to perform memory cell programming tasks, as will be discussed below.

Solely for illustrative purposes, SLC memory cells will be used to explain programming memory cells consistent with aspects of embodiments of this disclosure. However, embodiments consistent with the disclosure can also be applied to program MLC memory cells. To program SLC memory cells 20, several parameters can be determined by control circuit 22 or pre-determined by an external circuit and read into control circuit 22. For example, a programming start voltage $V_{pgm\_start}$ and a programming end voltage $V_{pgm\_end}$ for programming memory cells 20 can be determined by control circuit 22 or the external circuit mentioned above. Based on the determined programming start and end voltages, a bias range $V_{pgm\_range}$ is equal to $(V_{pgm\_end} - V_{pgm\_start})$. It is assumed that there are N (N being an integer and greater than 1) verify voltages to completely program all memory cells 20 and that a slope of bias steps is $Slope_{ISPP}$. The N verify voltages include (N-1) interim level verify voltages and a target/desired verify voltage. A minimum bias step can be set as $V_{pgm\_range}/2^N$. The programming bias can be determined according to the following Equation I:

$$Vpgm(n, \text{latch}) = Vpgm\_start + \frac{Vpgm\_range}{2^n} *$$
$$((1 - \text{latch}(1)) * 2^{n-1} + (1 - \text{latch}(2)) * 2^{n-2} + \ldots + (1 - \text{latch}(n)) * 2^0)$$

where Vpgm(n, latch) is the $n^{th}$ level programming bias, and latch(n) is obtained from each verify.

It is also assumed that a desired state of a memory cell is set at PV (volts). The verify voltages for the $n^{th}$ level can be determined according to the following Equation II:

$$\text{nth\_verifylevel} = PV - Slope_{ISPP} * Vpgm\_range * \left(\frac{1}{2^n} - \frac{1}{2^N}\right)$$

where $Slope_{ISPP}$ is the slope of bias steps.

Figure 3A:
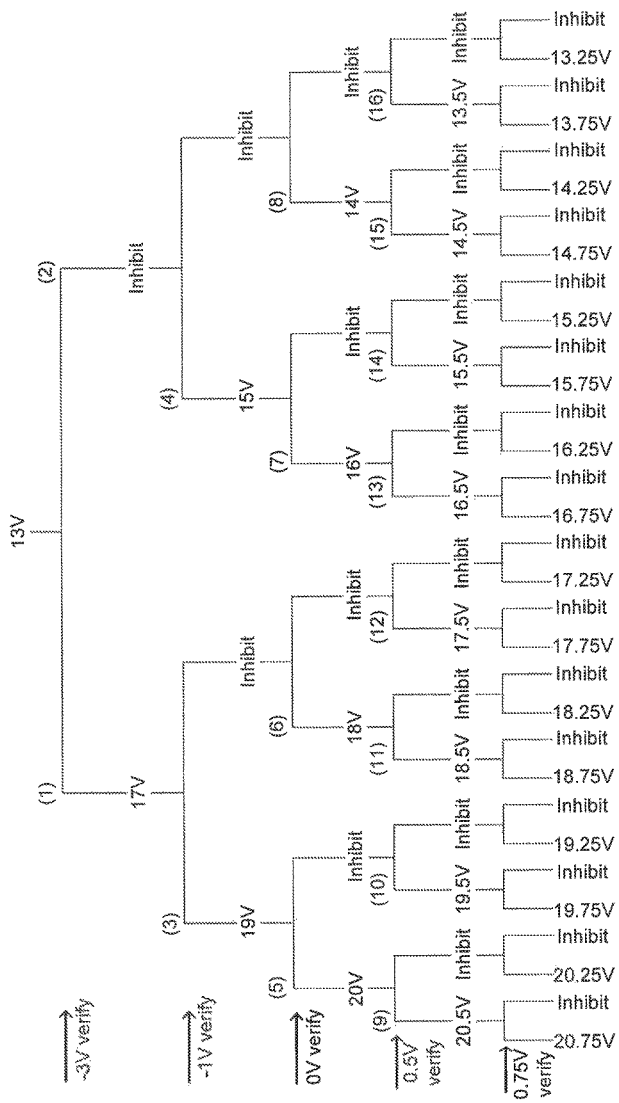
FIG. 3A shows an exemplary programming scheme consistent with some embodiments of this disclosure.

An example of how control circuit 22 programs memory cells 20 is illustrated in FIG. 3A. A programming start voltage $V_{pgm\_start}$ and a programming end voltage $V_{pgm\_end}$ for programming memory cells 20 are determined by control circuit 22, for example. In the example illustrated in FIG. 3A, $V_{pgm\_start}$ is set at 13 volts and $V_{pgm\_end}$ is set at 21 volts to program memory cells 20. If 0.25 volts is selected as the minimum bias step and the slope of the bias steps is 1, six verify voltages are applied to completely program memory cells 20. To illustrate, PV is set at about 0.75 volts.

Programming of memory cells 20 begins when control circuit 22 provides programming start voltage $V_{pgm\_start}$ (e.g., 13 volts) to all memory cells 20. Then, in a first verification step, control circuit 22 senses memory cells 20 and verifies the voltage levels of memory cells 20 against a first interim level verify voltage, for example, −3 volts. Control circuit 22 divides memory cells 20 into two groups. A portion of memory cells 20 having voltage levels that are less than −3 volts is designated as group 1. Group numbers are identified in parentheses in FIG. 3A. Memory cells of group 1 will receive a first level programming voltage (i.e., 17 volts in this example) in further programming. A portion of memory cells 20 having voltage levels that are equal to or greater than −3 volts is designated as group 2. Group 2 memory cells will be inhibited from receiving the first level programming voltage ("inhibit" as shown in FIG. 3A).

Control circuit 22 provides the first level programming voltage, 17 volts, to the group 1 memory cells. Then, in a second verification step, control circuit 22 senses all memory cells 20 and verifies the voltage levels of group 1 and group 2 memory cells against a second interim level verify voltage, for example, −1 volts. That is, memory cells programmed with 17 volts (group 1) and 13 volts (group 2) are verified in one verify step, which reduces time to perform verification and increases the throughput to verify memory cells.

Control circuit 22 then divides group 1 memory cells into two groups. In group 1, those memory cells having a voltage level less than −1 volts are assigned to a new group, group 3. Memory cells in group 3 will receive one of second level programming voltages in further programming. Moreover, in group 1, memory cells having a voltage level equal to or greater than −1 volts remain in group 1. Similarly, in group 2, those memory cells having a voltage level less than −1 volts are assigned to a new group, group 4. Memory cells in group 4 will receive one of the second level programming voltages in further programming. Moreover, in group 2, memory cells having a voltage level equal to or greater than −1 volts remain in group 2.

Control circuit 22 provides second level programming voltages, 19 and 15 volts, to group 3 and group 4 memory cells, respectively. At this time, memory cells remaining in groups 1 and 2 are inhibited from receiving the second level programming voltages ("inhibit"). Then, in a third verification step, control circuit 22 senses all memory cells 20 (groups 1-4) and verifies the voltage levels of memory cells 20 against a third interim level verify voltage, for example, 0 volts. The following explains the treatment by control circuit 22 of memory cells 20 after the third level verification step.

In group 3, those memory cells having a voltage level less than 0 volts are assigned to a new group, group 5. Memory cells in group 5 will receive one of third level programming voltages in further programming. Moreover, memory cells having a voltage level equal to or greater than 0 volts remain in group 3.

In group 1, those memory cells having a voltage level less than 0 volts are assigned to a new group, group 6. Memory cells in group 6 will receive one of the third level programming voltages in further programming. Moreover, memory cells having a voltage level equal to or greater than 0 volts remain in group 1.

In group 4, those memory cells having a voltage level less than 0 volts are assigned to a new group, group 7. Memory cells in group 7 will receive one of the third level programming voltages in further programming. Moreover, memory cells having a voltage level equal to or greater than 0 volts remain in group 4.

In group 2, those memory cells having a voltage level less than 0 volts are assigned to a new group, group 8. Memory cells in group 8 will receive one of the third level programming voltages in further programming. Moreover, memory cells having a voltage level equal to or greater than 0 volts remain in group 2.

Accordingly, four groups of memory cells programmed with different voltages are verified in one verifying step, which reduces time to perform verification and increases the throughput to verify memory cells.

Control circuit 22 further provides third level programming voltages, 20, 18, 16, and 14 volts, to memory cells in groups 5-8, respectively. At this time, memory cells remaining in groups 1-4 are inhibited from receiving the third level programming voltages ("inhibit"). Then, in a fourth verification step, control circuit 22 senses all memory cells 20 and verifies the voltage levels of all memory cells 20 (groups 1-8) against a fourth interim level verify voltage, for example, 0.5 volts. The following explains the treatment by control circuit 22 of memory cells 20 after the fourth level verification step.

In group 5, those memory cells having a voltage level less than 0.5 volts are assigned to a new group, group 9. Memory cells in group 9 will receive one of fourth level programming voltages in further programming. Moreover, memory cells having a voltage level equal to or greater than 0.5 volts remain in group 5.

In group 3, those memory cells having a voltage level less than 0.5 volts are assigned to a new group, group 10. Memory cells in group 10 will receive one of the fourth level programming voltages in further programming. Moreover, memory cells having a voltage level equal to or greater than 0.5 volts remain in group 3.

In group 6, those memory cells having a voltage level less than 0.5 volts are assigned to a new group, group 11. Memory cells in group 11 will receive one of the fourth level programming voltages in further programming. Moreover, memory cells having a voltage level equal to or greater than 0.5 volts remain in group 6.

In group 1, those memory cells having a voltage level less than 0.5 volts are assigned to a new group, group 12. Memory cells in group 12 will receive one of the fourth level programming voltages in further programming. Moreover, memory cells having a voltage level equal to or greater than 0.5 volts remain in group 1.

In group 7, those memory cells having a voltage level less than 0.5 volts are assigned to a new group, group 13. Memory cells in group 13 will receive one of the fourth level programming voltages in further programming. Moreover, memory cells having a voltage level equal to or greater than 0.5 volts remain in group 7.

In group 4, those memory cells having a voltage level less than 0.5 volts are assigned to a new group, group 14. Memory cells in group 14 will receive one of the fourth level programming voltages in further programming. Moreover, memory cells having a voltage level equal to or greater than 0.5 volts remain in group 4.

In group 8, those memory cells having a voltage level less than 0.5 volts are assigned to a new group, group 15. Memory cells in group 15 will receive one of the fourth level programming voltages in further programming. Moreover, memory cells having a voltage level equal to or greater than 0.5 volts remain in group 8.

In group 2, those memory cells having a voltage level less than 0.5 volts are assigned to a new group, group 16. Memory cells in group 16 will receive one of the fourth level programming voltages in further programming. Moreover, memory cells having a voltage level equal to or greater than 0.5 volts remain in group 2.

Control circuit 22 continues the above-described programming and verifying until all of memory cells 20 are programmed to the desired/target state, e.g., 0.75 volts, as shown in the lower part of FIG. 3A. As discussed above, multiple groups of memory cells programmed with different voltages are verified in one verifying step, which reduces time to perform verification and increases the throughput to verify memory cells. Moreover, memory cells are verified at one or more interim level verify voltages before being verified against the target/desired level verify voltage. For example, in the example embodiment shown in FIG. 3A, memory cells 20 are verified with interim verify voltages of −3, −1, 0, and 0.5 volts before being verified against a target/desired verify voltage of 0.75 volts. These verify voltages can be determined by equation II described above.

Figure 3B:
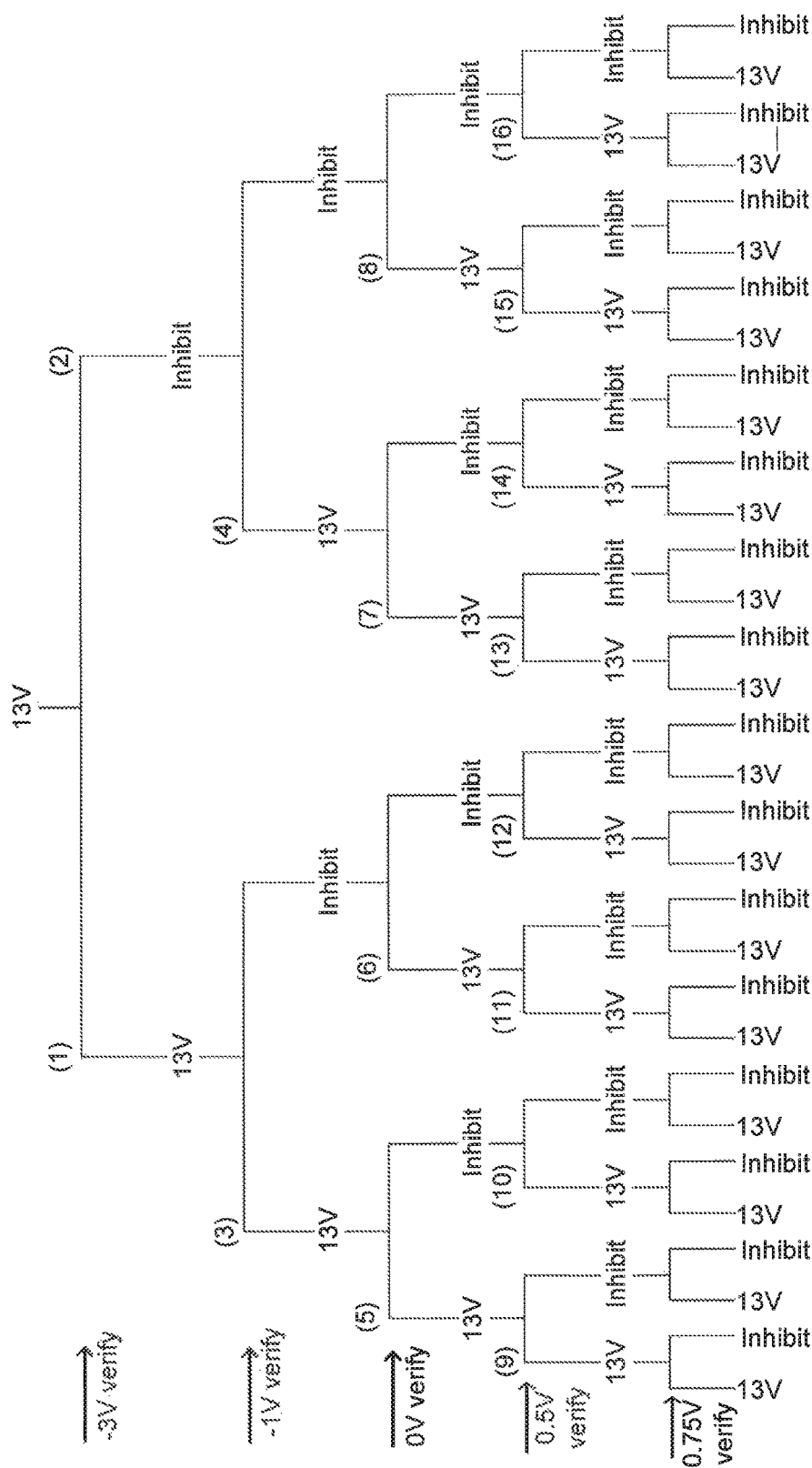
FIG. 3B shows an exemplary programming scheme consistent with some embodiments of this disclosure.

In some embodiments, control circuit 22 provides the same programming start voltage to each of the groups that are designated to receive further a programming voltage. For example, referring to FIG. 3B, group 1 memory cells is designated to receive a further programming voltage and programmed with 13 volts for a second time. Similarly, groups 3 and 4 memory cells are designed to receive a further programming voltage after being verified with −1 volt, and are programmed with 13 volts for a third time. The process may be repeated until memory cells are programmed to the desired level. For example, referring to FIG. 3B again, group 9 memory cells receive 13 volts programming voltage five times before being verified with the desired level.

Figure 4:
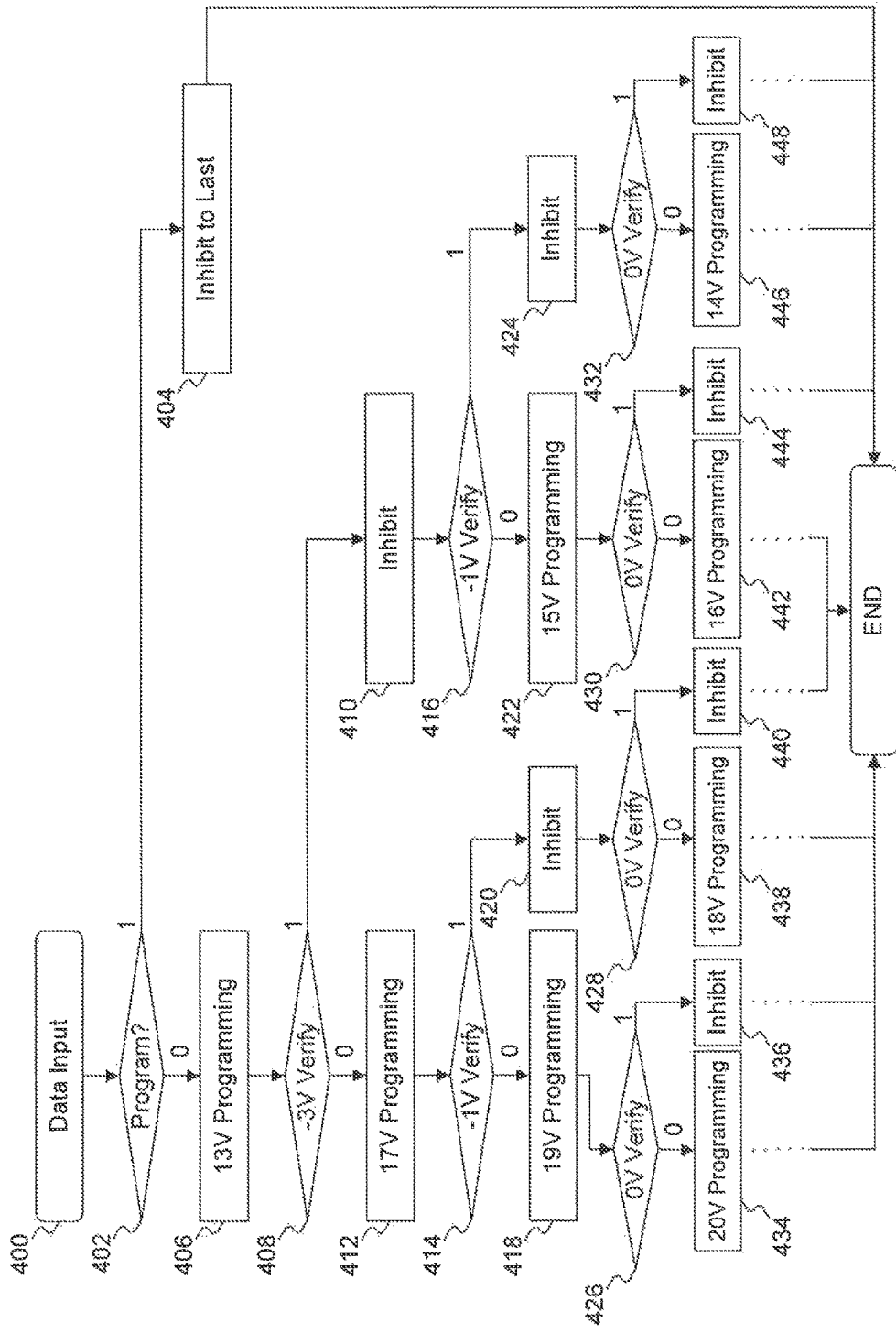
FIG. 4 is a flowchart of an exemplary method of programming memory cells consistent with some embodiments of this disclosure.

Next, a dichotomic method of programming memory cells 20 consistent with embodiments will be explained with reference to the flowchart in FIG. 4. As used here, the programming method is referred to as dichotomic because a selection between two alternatives is generally made at each stage. For convenience, the alternatives are designated "0" and "1". Referring to FIG. 4, at step 400, data is input into a memory device, for example, memory device 12 in FIG. 2. At step 402, it is determined by, for example, control circuit 22 whether memory cells 20 need to be programmed based on the input data. If it is determined that no programming is needed ("1"), the method advances to step 404 in which memory cells do not receive programming voltages. Alternatively, if it is determined that programming of memory cells 20 is needed ("0"), the method advances to step 406 in which a controller, e.g., control circuit 22, controls programming of memory cells 20. For example, control circuit 22 provides an initial programming voltage, e.g., 13 volts, to memory cells 20. At step 408, in a first verification step, control circuit 22 verifies voltage levels of memory cells 20 against a first predetermined verify voltage, e.g., −3 volts.

If it is determined that the voltage level of a memory cell is equal to or greater than the first interim level verify voltage ("1"), the method advances to step 410 in which the memory cell is designated as belonging to a group, e.g., group 2 in FIG. 3A, that does not receive a first level programming voltage ("Inhibit"). Alternatively, if it is determined that the voltage level of a memory cell is less than the first interim level verify voltage ("0"), the memory cell is designated as belonging to a group, e.g., group 1 in FIG. 3A, and the method advances to step 412. At step 412, control circuit 22 provides the first level programming voltage to the group 1 memory cell. The first level programming voltage, e.g., 17 volts, is set to be higher than the initial programming voltage.

At step 414, control circuit 22 verifies the voltage levels of memory cells in group 1 which are programmed with the first level programming voltage, against a second interim level verify voltage, e.g. −1 volts. At step 416, control circuit 22 verifies the voltage levels of memory cells in group 2 which are programmed with the initial programming voltage at step 406, against the second interim level verify voltage, e.g., −1 volts. Control circuit 22 may perform the verification processes at steps 414 and 416 simultaneously or sequentially in no particularly order.

Following step 414, if it is determined that the voltage level of a memory cell is equal to or greater than the second interim level verify voltage ("1"), the method advances to step 420 in which the memory cell is designated in a group, e.g., remaining in group 1 in FIG. 3A, that does not receive a second level programming voltage ("Inhibit"). Alternatively, if it is determined that the voltage level of a memory cell is less than the second interim level verify voltage ("0"), the memory cell is designated as belonging to a group, e.g., group 3 in FIG. 3A, and the method advances to step 418. At step 418, control circuit 22 provides the second level programming voltage, e.g., 19 volts, to the group 3 memory cell. The second level programming voltage provided to memory cells in group 3 is set to be higher than the first level programming voltage.

Moreover, following step 416, if it is determined that the voltage level of a memory cell is equal to or greater than the second interim level verify voltage ("1"), the method advances to step 424 in which the memory cell is designated in a group, e.g., remaining in group 2 in FIG. 3A, that does not receive a second level programming voltage ("Inhibit"). Alternatively, if it is determined that the voltage level of a memory cell is less than the second interim level verify voltage ("0"), the memory cell is designated as belonging to a group, e.g., group 4 in FIG. 3A, and the method advances to step 422. At step 422, control circuit 22 provides a second level programming voltage to the group 4 memory cell. The second level programming voltage, e.g., 15 volts, provided to memory cells in group 4 is set to be lower than the first level programming voltage but higher than the initial programming voltage.

At steps 426, 428, 430, and 432, control circuit 22 verifies the memory cells in the four groups identified in steps 418, 420, 422, and 424 against a third predetermined verify voltage, e.g., 0 volts. Control circuit 22 may perform the verification for those groups simultaneously or sequentially in no particularly order. At steps 426, 428, 430, and 432, control circuit 22 applies verifying protocol similar to those applied in steps 414 and 416 to the four groups identified in steps 418, 420, 422, and 424. The verification at steps 426, 428, 430, and 432 results in memory cells having voltage levels greater than or equal to 0 volts remaining in their previous group designation and not receiving a third level programming voltages ("Inhibit"). Memory cells having voltage levels less than the third predetermined level of 0 volts are designated as groups 5, 6, 7, and 8, respectively, to receive further programming voltages. As shown in FIG. 4, at steps 434, 438, 442, and 446, control circuit 22 provides third level programming voltages, e.g., 20, 18, 16, and 14 volts, respectively, to four groups that are designated at steps 426, 428, 430, 432 to receive further programming voltages, while groups that are designated at steps 426, 428, 430, 432 as "inhibit" are inhibited from receiving further programming voltages at steps 436, 440, 444, and 448, respectively.

Still with reference to FIG. 4, control circuit 22 continues the above-described programming-and-verifying processes until all memory cells are programmed and verified to be in a desired/target state, e.g., 0.75 volts, which ends the method at step 450.

In some embodiment, memory cells 20 programmed by different voltages can be verified at the same verification process. For example, referring to FIG. 4, memory cells receiving the 17-volt programming voltage (step 412) and memory cells receiving the 13-volt programming voltage (step 406) can be verified at steps 414 and 416, respectively. Because both groups are verified with −1 volts, the verification can be performed in the same process. Similarly, four groups that are programmed with different voltages (19, 17, 15, and 13 volts) can be verified with the same verify voltage (0 volts) at steps 426, 428, 430, and 432 at the same time. Accordingly, the time for performing verification can be reduced and throughput of programming memory cells to a desired state can be increased.

Figure 5:
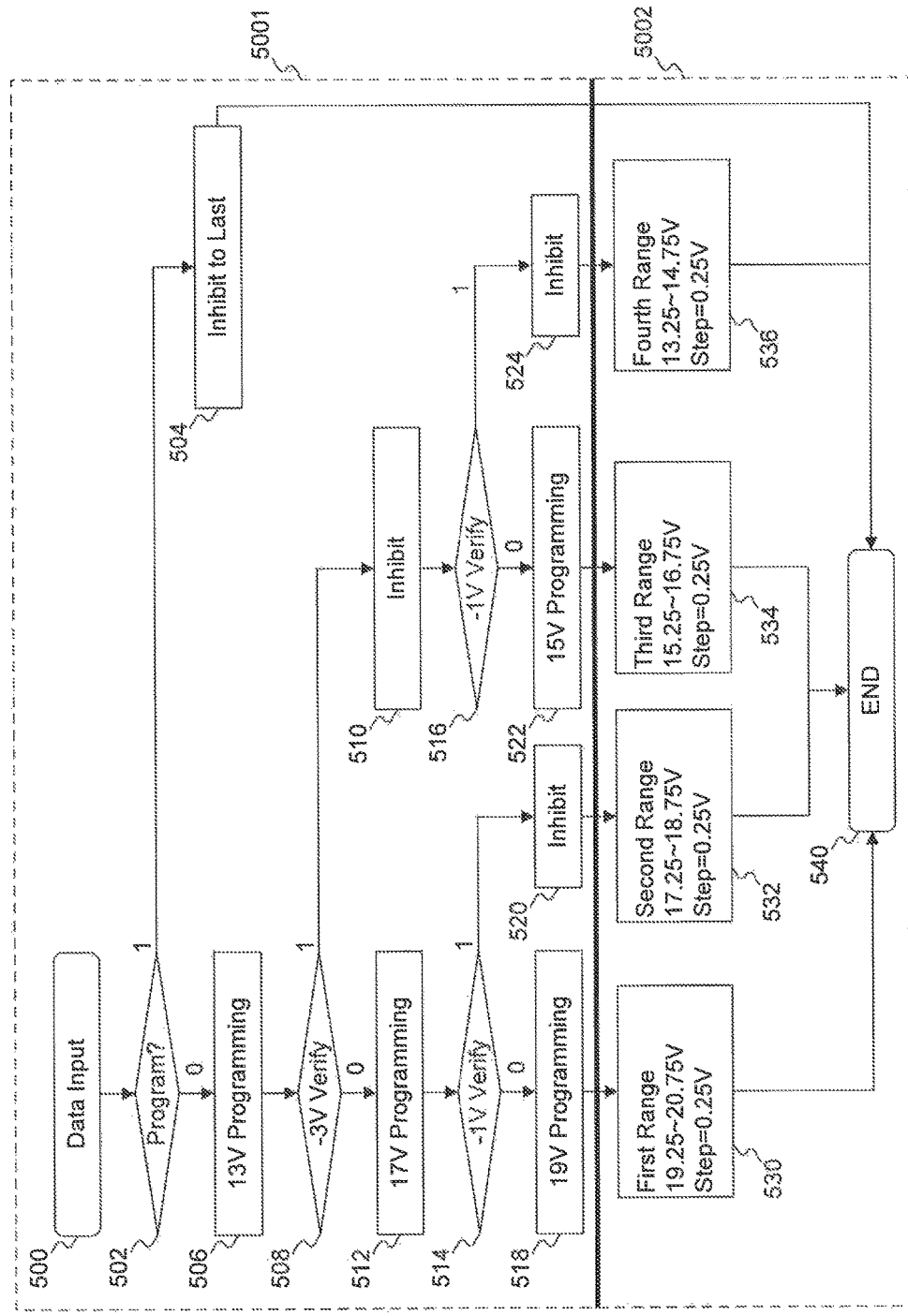
FIG. 5 is a flowchart of another exemplary method of programming memory cells consistent with some embodiments of this disclosure.

FIG. 5 is a flowchart of another exemplary method of programming memory cells 20. Referring to FIG. 5, programming-and-verifying processes at steps 500-524 are similar to those discussed with respect to steps 400-424 in FIG. 4, respectively, so that a detailed description of steps 500-524 is not provided. Steps 500-524 are referred to herein as a first programming scheme 5001. Memory cells which have been programmed with 19 volts at step 518 are referred to herein as group A memory cells. Memory cells which have been programmed with 17 volts at step 512 and which receive no programming voltage at step 520 are referred to herein as group B memory cells. Memory cells which have been programmed with 15 volts at step 522 are referred to herein as group C memory cells. Memory cells which have been programmed with 13 volts at step 506 and which receive no programming voltage at steps 510 and 524 are referred to herein as group D memory cells. Steps 530-536 and a programming end point at step 540 are referred to herein as a second programming scheme 5002.

Memory cells in group A receive incremental programming voltages between, for example, 19.25 and 20.75 volts with an increment of, for example, 0.25 volts. The voltage increment at step 530 and steps 500-524 may be different. At step 530, control circuit 22 provides an initial programming voltage (19.25 volts) to the group A memory cells. Subsequently, control circuit 22 senses memory cells in Group A and verifies the voltage levels of group A memory cells against a desired memory state, for example, 1 volt. After the verification, control circuit 22 provides a programming voltage (19.5 volts) incrementally increased by 0.25 volts from the initial programming voltage to those of the memory cells in group A that have a voltage level less than the desired memory state. Control circuit 22 then senses memory cells in group A and verifies the voltage levels of group A memory cells against the desired memory state. Control circuit 22 repeats these programming and verifying processes to allow all memory cells in group A to reach the desired state. For example, the final programming voltage is set at 20.75 volts. As explained above, at step 530, the programming and verifying processes are alternatively performed.

The programming and verifying processes performed in group A will similarly be performed in groups B-D to allow memory cells in each respective group to reach the desired state, e.g., 1 volt in this example. The difference is that each group will have a different programming voltage range. For example, the programming voltage range is 17.25-18.75 volts, 15.25-16.75 volts, and 13.25-14.75 volts in groups B, C, and D, respectively. The desired memory state in all groups is the same, i.e., 1 volt in this example. Steps 530, 532, 534, and 536 may be performed simultaneously or sequentially in no particular order. After all memory cells have been verified as reaching the desired/target state, the process ends at step 540.

The programming voltage range for each group may be determined as follows:

---

Start bias voltage of $1^{st}$ group: $V_{pgm\_start}$;
End bias voltage of $1^{st}$ group: close to, but less than $V_{pgm\_start} + V_{pgm\_range}/2^m$;
Start bias voltage of $2^{nd}$ group: $V_{pgm\_start} + V_{pgm\_range}/2^m + V_{step}$;
End bias voltage of $2^{nd}$ group: close to, but less than $V_{pgm\_start} + 2*V_{pgm\_range}/2^m$;

.
.
.

Start bias voltage of $(2^{(m-1)})^{th}$ group: $V_{pgm\_start} + (2^m-2)*V_{pgm\_range}/2^m + V_{step}$;
End bias voltage of $(2^{(m-1)})^{th}$ group: close to, but less than $V_{pgm\_start} + (2^m-1)*V_{pgm\_range}/2^m$;
Start bias voltage of $(2^m)^{th}$ group: $V_{pgm\_start} + (2^m-1)*V_{pgm\_range}/2^m + V_{step}$;
End bias voltage of $(2^m)^{th}$ group: close to, but less than $V_{pgm\_end}$,

--- where m is the number of memory cell groups at the beginning of the second programming scheme 5002; $V_{pgm\_start}$ is programming start voltage; $V_{pgm\_end}$ is programming end voltage; $V_{step}$ is the minimum bias voltage increment; $V_{pgm\_range}$ equals to $(V_{pgm\_end}-V_{pgm\_start})$.

The programming method in FIG. 5 includes two portions: first programming scheme 5001 including steps 500-524 and second program scheme 5002 including steps 530-540 As explained above, first programming scheme 5001 is similar to those in FIGS. 3 and 4.

During first programming scheme 5001, memory cells that receive programming voltages are verified against different interim verify voltages. For example, in the first verification step (step 408 in FIG. 4), memory cells may be verified with an interim level verify voltage of −3 volts. Further, in the second verification step (steps 414 and 416 in FIG. 4), memory cells may be verified with an interim level verify voltage of −1 volts.

During second programming scheme 5002, memory cells are verified against the target or desired verify voltage whenever memory cells have been programmed. For example, at step 530, group A memory cells are verified against the target or desired verify voltage of 1 volt each time after memory cells having voltage levels less than the desired verify voltage are programmed with programming voltages of 19.25, 19.5, 19.75, 20, 20.25, 20.5, and 20.75 volts. In this example embodiment, memory cells may be verified seven times but all against the target verify voltage of 1 volt. Moreover, although each of groups A-D has a different programming voltage range, they are all verified against the same target or desired level (1 volt in this example). As will be discussed below, this hybrid programming method as shown in FIG. 5 that includes first programming scheme 5001 and second programming scheme 5002 may reduce a random telegraphic noise (RTN) effect in programming memory cells.

RTN may affect the verifying process and lead to errors in group designation. In first programming scheme 5001, RTN may result in a high boundary tail of the final programming verify distribution. To mitigate such a result, each of the interim verify voltages can be lowered. For example, the interim verify voltages in FIG. 5 can be set to $(-3-V_{RTN\_width}/2)$ and $(-1-V_{RTN\_width}/2)$ volts, where $V_{RTN\_width}$ is the voltage range of RTN. Moreover, RTN may result in a low boundary tail of the final programming verify distribution in second programming scheme 5002. To mitigate such a result, the programming voltage range of second programming scheme 5002 can be increased. For example, each of the programming voltage ranges at steps 530, 532, 534, and 536 (FIG. 5) can be increased. In some embodiments, the added range should be greater than $V_{RTN\_width}$.

Referring to FIG. 5, second programming scheme 5002 is arranged after the second verification process (steps 514 and 516) and the second programming processes (steps 518, 520, 522, and 524) are completed. In some embodiments, second programming scheme 5002 may begin other than after the second verification process is completed. For example, the second programming scheme may be arranged to immediately follow steps 510 and 512.

In some embodiments, the above-described programming methods may be applied to an SLC memory device. The criteria for programming an SLC memory device include the threshold voltage of all memory cells after programming with the programming start voltage being below the final target verify voltage, and the threshold voltage of all memory cells after programming with the programming end voltage being above the final target verify voltage. In some embodiments, interference between memory cells may be considered to more accurately program memory cells.

In some embodiments, the above-described programming methods may be applied to a MLC memory device. To program a MLC memory device, more than one final target verify voltage should be determined. The criteria for programming a MLC memory device include the threshold voltage of all memory cells after programming, with the programming start voltage being below the lowest final target verify voltage, and the threshold voltage of all memory cells after programming with the programming end voltage being above the highest final target verify voltage. In some embodiments, interference between memory cells may be considered to more accurately program memory cells.

In some embodiments, the above-described programming methods may be implemented by a controller, such as control circuit 22. In some embodiments, the above-described programming methods may be implemented by instructions and executed by a processor. The instructions may be stored in a non-transitory storage medium.

Figure 6:
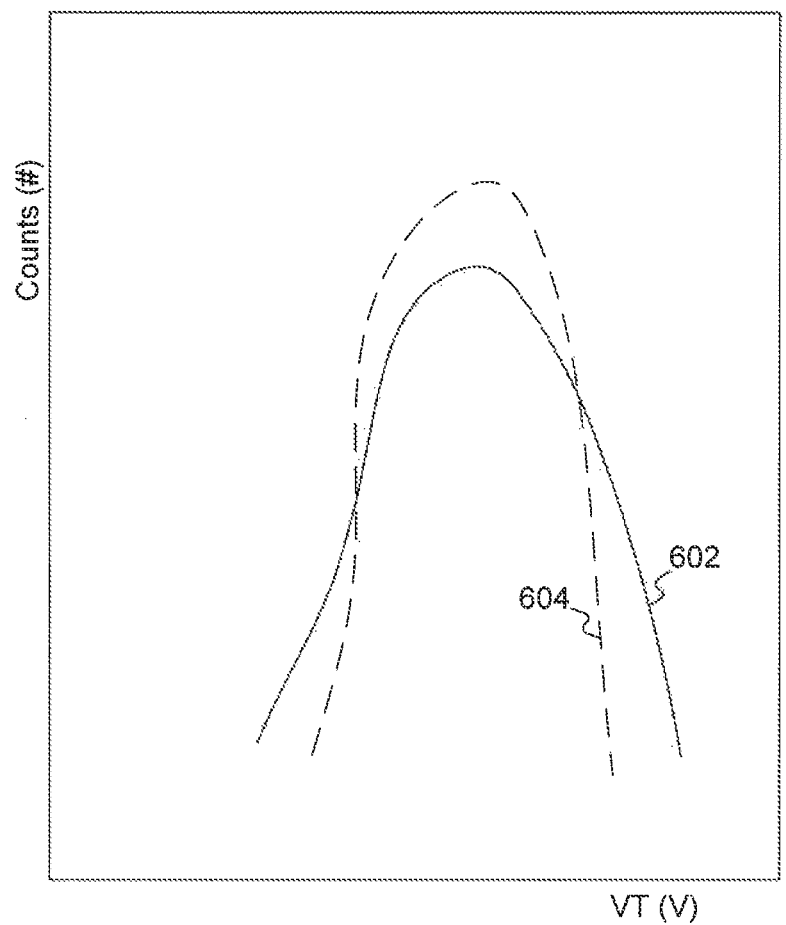
FIG. 6 shows a diagram of simulation results of exemplary programming methods consistent with some embodiments of this disclosure.

FIG. 6 shows simulation results of exemplary programming methods consistent with some embodiments of this disclosure. Curve 602 represents a dichotomic programming method as discussed above with respect to FIGS. 3 and 4, while curve 604 represents a hybrid programming method as discussed above with respect to FIG. 5. The simulation results show that the threshold voltage (VT) distribution is wider in curve 602 than in curve 604, indicating that RTN may have more influence in curve 602 than in curve 604.

Figure 7:
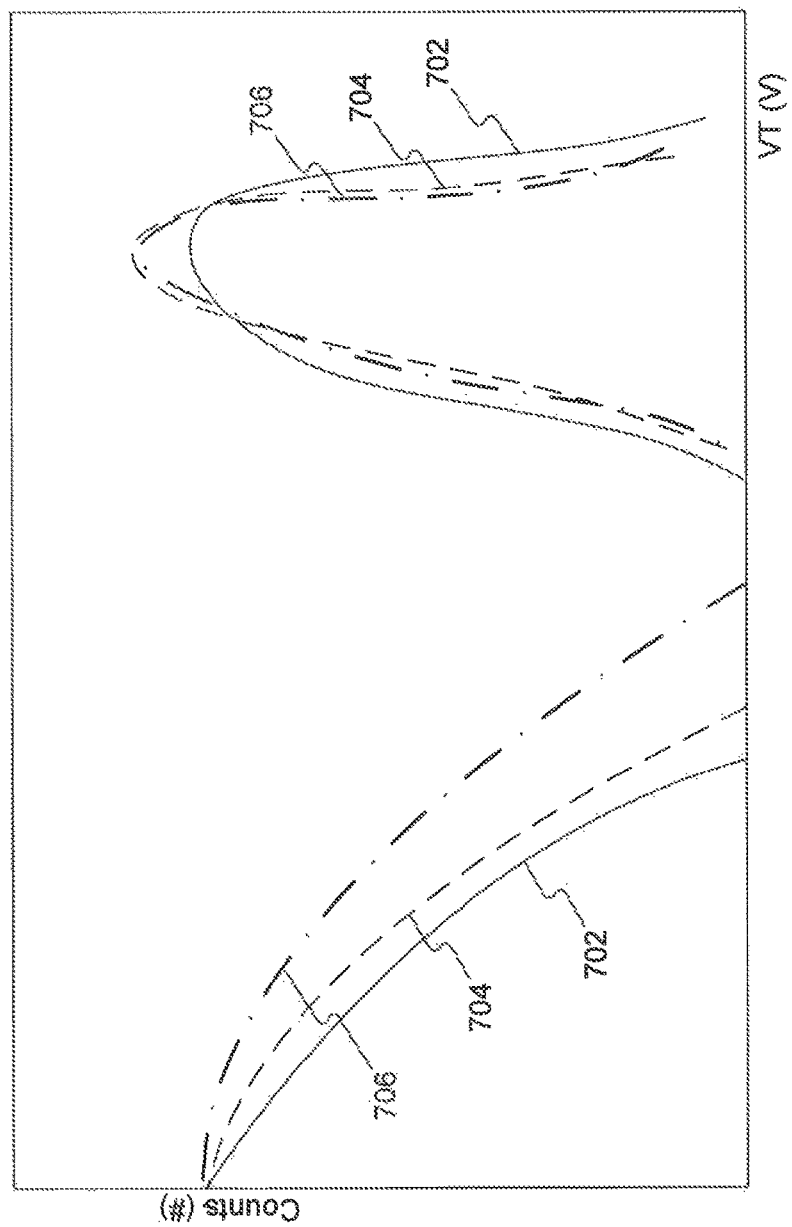
FIG. 7 shows a diagram of experiment results of exemplary programming methods consistent with some embodiments of this disclosure.

FIG. 7 shows experimental results of exemplary programming methods consistent to some embodiments of this disclosure. Curves 702, 704, and 706 in FIG. 7 represent a dichotomic programming method, a hybrid programming method, and an ISPP method. Curve 702 indicates that memory cells programmed with a dichotomic programming method have less disturbance and are consistent with the simulation results of FIG. 6 (curve 602). Curve 704 indicates that memory cells programmed with a hybrid programming method have modest disturbance and are less influenced by RTN. Curve 706 indicates that memory cells programmed with an ISPP method have the highest disturbance and have an RTN effect similar to curve 704. In some embodiment, a hybrid programming method may improve programming throughput by about 30-50% for SLC, about 55-90% for DLC, and about 90-120% for TLC (triple level cell).

Figure 8A:
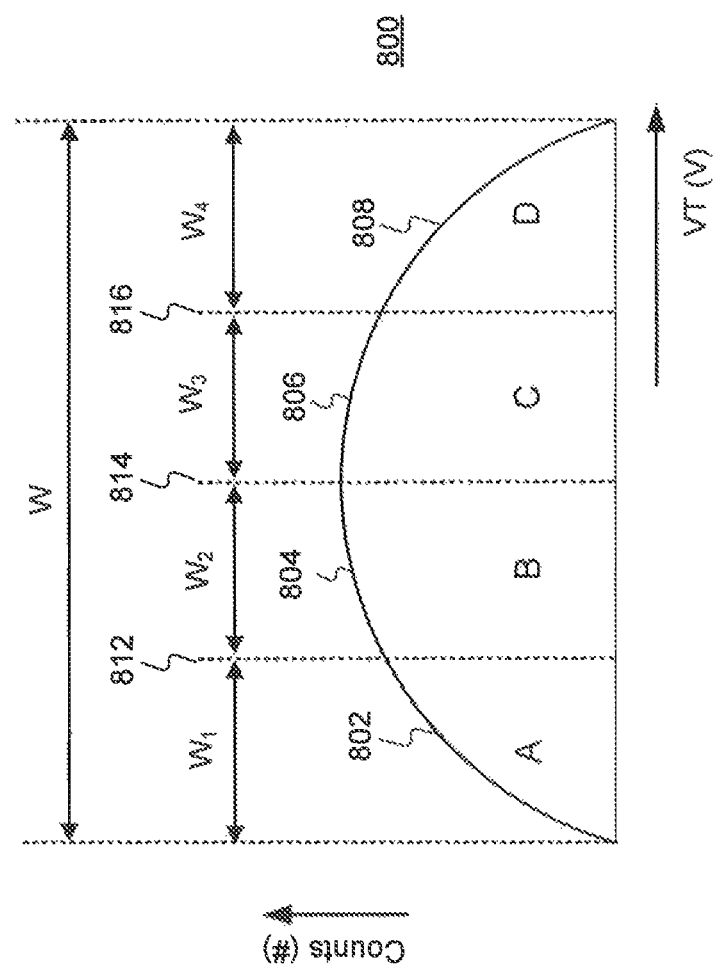
FIGS. 8A-8C shows exemplary threshold voltage distribution diagrams of memory cells consistent with some embodiments of this disclosure.

In some embodiments, RTN and programming fluctuation may be considered in determining programming and verify voltages. FIG. 8A shows an exemplary threshold voltage range 800 having a width of W volts of memory cells 20, which have been programmed with a programming start voltage (e.g., step 406 in FIG. 4 or step 506 at FIG. 5). Referring to FIG. 8A, the horizontal axis represents threshold voltages of memory cells and the vertical axis represents the number of memory cells. Threshold voltage range 800 includes a first range 802 having a threshold voltage range $W_1$ of group A cells, a second range 804 having a threshold voltage range $W_2$ of group B cells, a third range 806 having a threshold voltage range $W_3$ of group C cells, and a fourth range 808 having a threshold voltage range $W_4$ of group D cells. Without considering RTN and programming voltage fluctuation, the width of each of first range 802, second range 804, third range 806, and fourth range 808 can be equal to each other. That is, $W_1=W_2=W_3=W_4=\frac{1}{4}W$. Verify voltages 812, 814, and 816 are set to equally divide threshold voltage range 800 into first range 802, second range 804, third range 806, and fourth range 808.

Figure 8B:
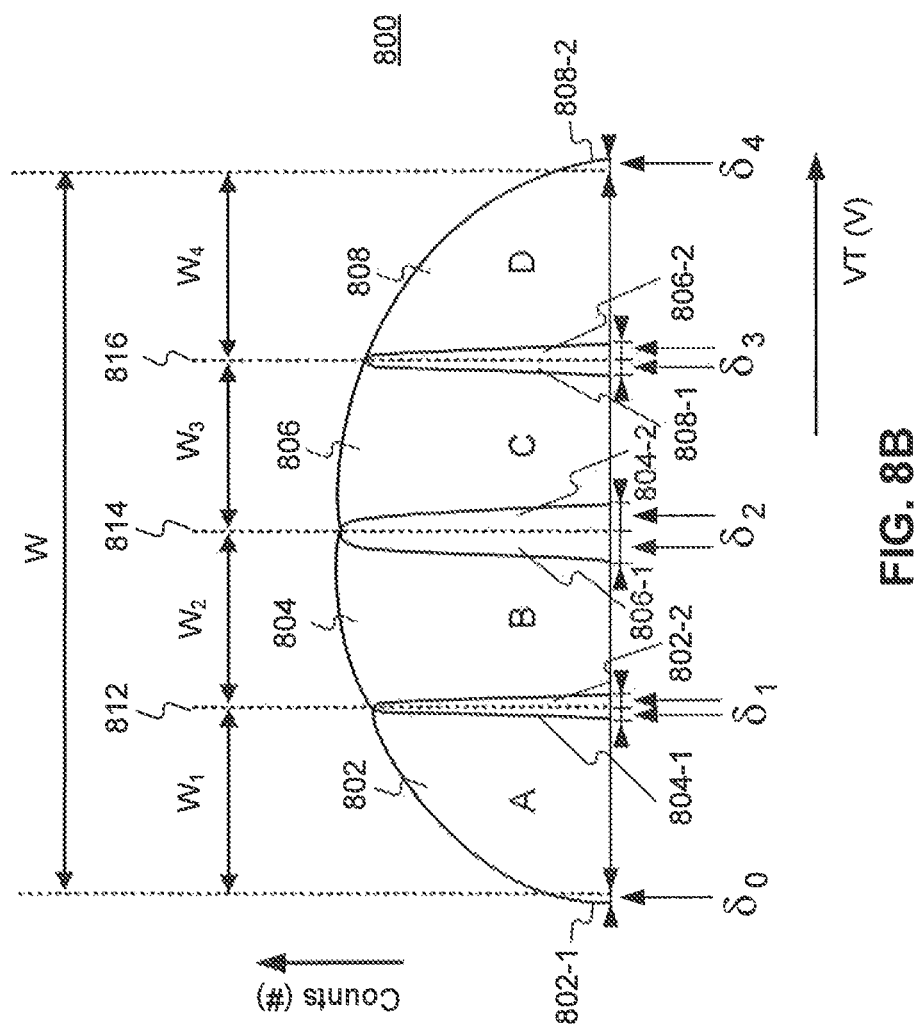

However, when RTN and programming voltage fluctuation are considered, each of voltage ranges includes high and low boundary tails. An example is shown in FIG. 8B, which has the same coordinate system as FIG. 8A. For example, referring to FIG. 8B, first range 802 includes a low boundary tail 802-1 having a width of $\delta_0$ volts and a high boundary tail 802-2 having a width of $\delta_1$ volts; second range 804 includes a low boundary tail 804-1 having a width of $\delta_1$ volts and a high boundary tail 804-2 having a width of $\delta_2$ volts; third range 806 includes a low boundary tail 806-1 having a width of $\delta_2$ volts and a high boundary tail 806-2 having a width of $\delta_3$ volts; fourth range 808 includes a low boundary tail 808-1 having a width of $\delta_3$ volts and a high boundary tail 808-2 having a width of $\delta_4$ volts. Accordingly, the widths of first, second, third, and fourth ranges 802, 804, 806, 808 become $\delta_0+W_1+\delta_1$, $\delta_1+W_2+\delta_2$, $\delta_2+W_3+\delta_3$, and $\delta_3+W_4+\delta_4$, respectively. As shown in FIG. 8B, each of ranges 802, 804, 806, 808 overlaps with at least one adjacent range.

Figure 8C:
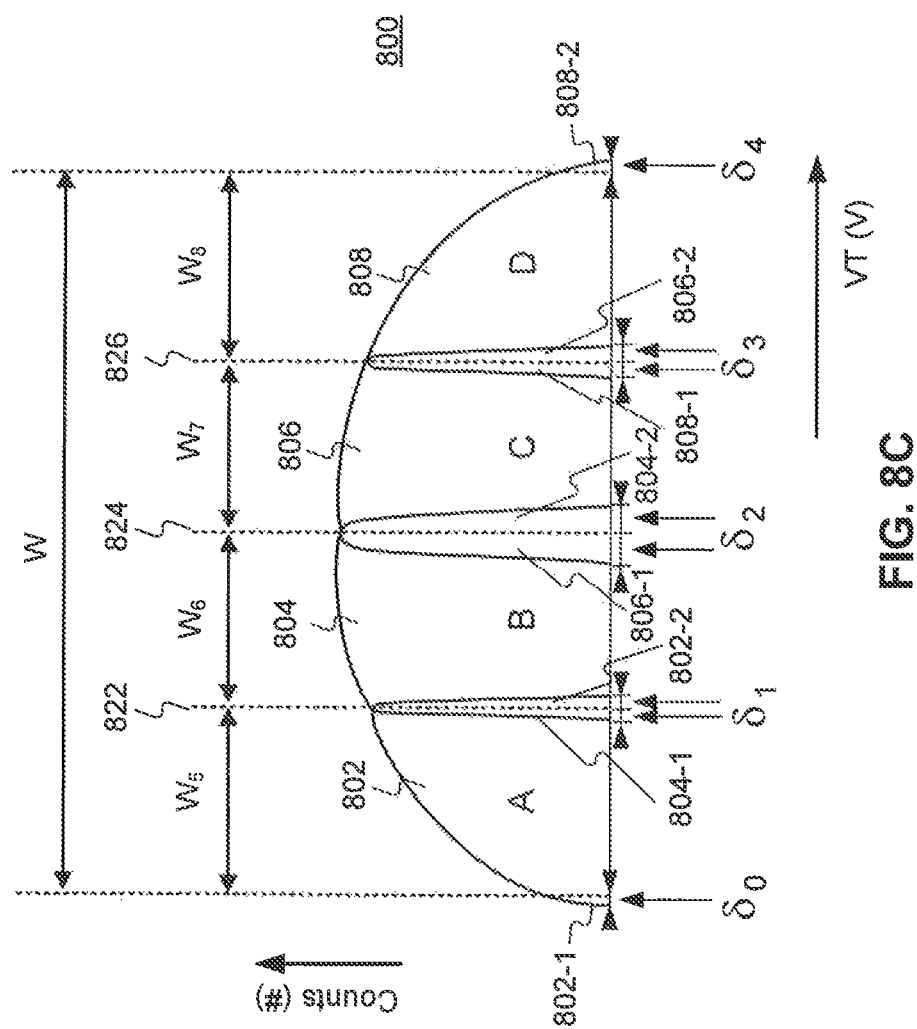

In some embodiments, $\delta_0$, $\delta_1$, $\delta_2$, $\delta_3$, and $\delta_4$ may be obtained by measuring the low and high boundary tails of memory cells 20 or through simulation. In some embodiments, a database of boundary tails may be established to facilitate the determination of boundary tails for memory cells. In some embodiments, the boundary tails may have the following relationship: $\delta_2 \geq \delta_1 \geq \delta_0 \approx \delta_4$, which is based on bilateral symmetry. If each of cell groups A-D has the same programming range after the RTN and programming fluctuation are taken into consideration, the group ISPP programming can stop at about the same time. The following equations can be used to determine optimized interim level verify voltages 822, 824, 826 shown in FIG. 8C:

$$W_5+W_6+W_7+(Pgm_{max}-Pgm_{min})\cdot Slope = W_1+W_2+W_3+W_4, \text{ and}$$

$$\delta_0+W_5+\delta_1=\delta_1+W_6+\delta_2=W_7+\delta_3=\delta_3+W_8+\delta_4,$$

where $W_5$, $W_6$, $W_7$, $W_8$ are optimized threshold voltage ranges of groups A-1D memory cells, respectively; $Pgm_{max}$ is a maximum programming voltage; $Pgm_{min}$ is a minimum programming voltage; and Slope is the slope of a programming function. These optimized verify voltages 822, 824, 826 may be applied to the programming and verification schemes as shown in FIGS. 3-5 to improve accuracy and speed of programming memory cells 20.

Figure 9A:
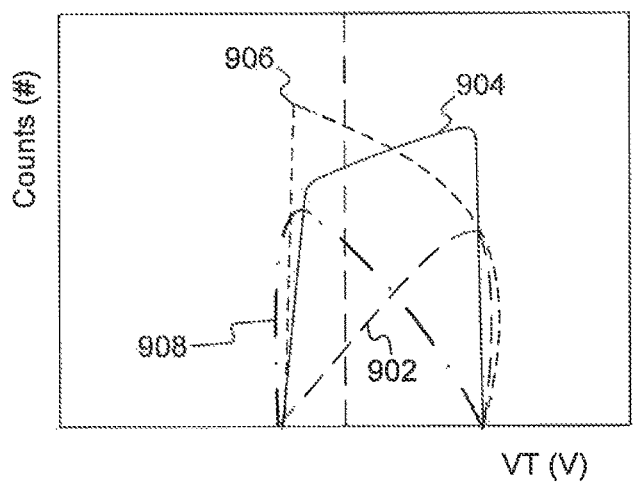
FIGS. 9A-9C show exemplary threshold voltage distribution diagrams of memory cells consistent with some embodiments of this disclosure.

FIG. 9A shows an exemplary memory-cell threshold voltage diagram of an ideal case in which RTN and programming fluctuation do not exist. Referring to FIG. 9A, the horizontal axis represents threshold voltages of memory cells and the vertical axis represents the number of memory cells. Curves 902, 904, 906, 908 represent the threshold voltage ranges of groups A, B, C, D memory cells, respectively, after they are programmed. As shown in FIG. 9A, because there is no RTN and programming fluctuation, no low and high boundary tails are in curves 902, 904, 906, 908.

Figure 9B:
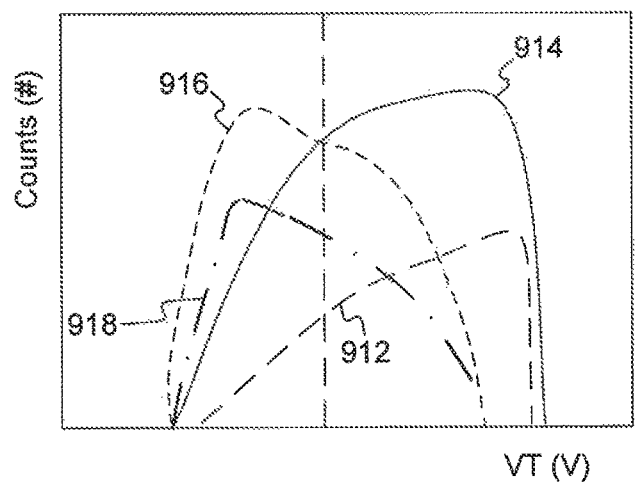

FIG. 9B shows an exemplary memory-cell threshold voltage diagram of a case in which RTN and programming fluctuation exist in memory cells which, however, are not verified with optimized verify voltages. Referring to FIG. 9B, which has the same coordination system as FIG. 9A, curves 912, 914, 916, 918 represent the threshold voltage ranges of groups A, B, C, D memory cells, respectively, after they are programmed. As shown in FIG. 9B, because the verify voltages are not optimized, designation of memory cells into groups may not be correct so that the memory cells may not be correctly programmed. This results in wide threshold voltage ranges shown by curves 912, 914, 916, 918, which, in turn, increase the time to program the memory cells.

Figure 9C:
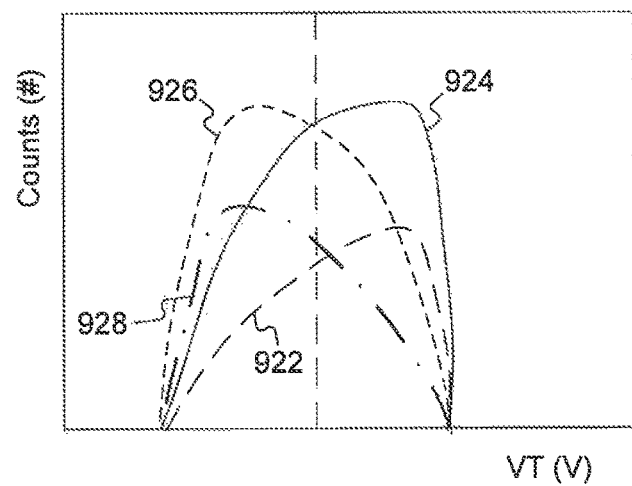

FIG. 9C shows an exemplary memory-cell threshold voltage of a case in which RTN and programming fluctuation exist in memory cells which are verified with optimized verify voltages. Referring to FIG. 9C, which has the same coordination system as FIG. 9A, curves 922, 924, 926, 928 represent the threshold voltage ranges for groups A, B, C, D memory cells, respectively, after they are programmed. Because memory cells are verified with optimized verify voltages, the accuracy of designating memory cells into groups for programming is improved so that memory cells can be more efficiently programmed. As shown in FIG. 90, the threshold voltage ranges are narrower than those in FIG. 9B, indicating that programming time can be reduced.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device comprising:
   a plurality of memory cells; and
   a control circuit coupled to the memory cells, the control circuit being configured to:

provide a first programming voltage to the memory cells;

verify the memory cells against an interim level verify voltage to divide the memory cells into a first group of memory cells and a second group of memory cells according to whether the memory cells do not reach or do reach the interim level verify voltage, wherein the first group of memory cells does not reach the interim level verify voltage and the second group of memory cells reaches the interim level verify voltage;

provide a second programming voltage to the first group of memory cells and inhibit the second group of memory cells from receiving the second programming voltage, the second programming voltage being greater than or equal to the first programming voltage; and verify the first group of memory cells and the second group of memory cells against a desired level voltage, wherein the desired level voltage is greater than the interim level verify voltage.

2. The memory device according to claim 1, wherein the interim level verify voltage is a first interim level verify voltage, the control circuit being further configured to, before verifying against the desired level voltage:

verify the first group of memory cells and the second group of memory cells against a second interim level verify voltage to divide the first group of memory cells into a third group of memory cells and a fourth group of memory cells according to whether the memory cells do not reach or do reach the second interim level verify voltage, respectively, and to divide the second group of memory cells into a fifth group of memory cells and a sixth group of memory cells according to whether the memory cells do not reach or do reach the second interim level verify voltage, respectively, the second interim level verify voltage being greater than or equal to the first interim level verify voltage;

provide a third programming voltage to the third group of memory cells and inhibit the fourth group of memory cells from receiving the third programming voltage, the third programming voltage being greater than or equal to the second programming voltage; and provide a fourth programming voltage to the fifth group of memory cells and inhibit the sixth group of memory cells from receiving the fourth programming voltage.

3. The memory device according to claim 2, wherein the control circuit is configured to simultaneously verify the first group of memory cells and the second group of memory cells against the second interim level verify voltage.

4. The memory device according to claim 1, wherein the desired level voltage is greater than zero volts or the interim level verify voltage is less than zero volts.

5. A method of programming memory cells of a memory device, the method comprising:

providing a first programming voltage to the memory cells;

verifying the memory cells against an interim level verify voltage to divide the memory cells into a first group of memory cells and a second group of memory cells according to whether the memory cells do not reach or do reach the interim level verify voltage, wherein the first group of memory cells does not reach the interim level verify voltage and the second group of memory cells reaches the interim level verify voltage;

providing a second programming voltage to the first group of memory cells and inhibiting the second group of memory cells from receiving the second programming voltage, the second programming voltage being greater than or equal to the first programming voltage; and verifying the first group of memory cells and the second group of memory cells against a desired level voltage, wherein the desired level voltage is greater than the interim level verify voltage.

6. The method according to claim 5, wherein the interim level verify voltage is a first interim level verify voltage, the method further comprising, before verifying against the desired level voltage:

verifying the first group of memory cells and the second group of memory cells against a second interim level verify voltage to divide the first group of memory cells into a third group of memory cells and a fourth group of memory cells according to whether the memory cells do not reach or do reach the second interim level verify voltage, respectively, and to divide the second group of memory cells into a fifth group of memory cells and a sixth group of memory cells according to whether the memory cells do not reach or do reach the second interim level verify voltage, respectively, the second interim level verify voltage being greater than or equal to the first interim level verify voltage;

providing a third programming voltage to the third group of memory cells and inhibiting the fourth group of memory cells from receiving the third programming voltage, the third programming voltage being greater than or equal to the second programming voltage; and providing a fourth programming voltage to the fifth group of memory cells and inhibiting the sixth group of memory cells from receiving the fourth programming voltage.

7. The method according to claim 6, wherein verifying the first group of memory cells and the second group of memory cells against the second interim level verify voltage is performed simultaneously.

8. The method according to claim 5, wherein the desired level voltage is greater than zero volts or the interim level verify voltage is less than zero volts.

9. A non-transitory storage medium tangibly storing instructions which, when executed by a processor, cause the processor to perform a method of programming memory cells of a memory device, the method comprising:

providing a first programming voltage to the memory cells;

verifying the memory cells against an interim level verify voltage to divide the memory cells into a first group of memory cells and a second group of memory cells according to whether the memory cells do not reach or do reach the interim level verify voltage, wherein the first group of memory cells does not reach the interim level verify voltage and the second group of memory cells reaches the interim level verify voltage;

providing a second programming voltage to the first group of memory cells and inhibiting the second group of memory cells from receiving the second programming voltage, the second programming voltage being greater than or equal to the first programming voltage; and verifying the first group of memory cells and the second group of memory cells against a desired level voltage, wherein the desired level voltage is greater than the interim level verify voltage.

10. An electronic device including a memory device, the memory device comprising:
- a plurality of memory cells; and
- a control circuit coupled to the memory cells and configured to:
  - provide a first programming voltage to the memory cells;
  - verify the memory cells against an interim level verify voltage to divide the memory cells into a first group of memory cells and a second group of memory cells according to whether the memory cells do not reach or do reach the interim level verify voltage, wherein the first group of memory cells does not reach the interim level verify voltage and the second group of memory cells reaches the interim level verify voltage;
  - provide a second programming voltage to the first group of memory cells and inhibit the second group of memory cells from receiving the second programming voltage, the second programming voltage being greater than or equal to the first programming voltage; and
  - verify the first group of memory cells and the second group of memory cells against a desired level voltage, wherein the desired level voltage is greater than the interim level verify voltage.

* * * * *